United States Patent
Yonemura et al.

(10) Patent No.: US 8,857,952 B2
(45) Date of Patent: Oct. 14, 2014

(54) LIQUID EJECTING HEAD AND LIQUID EJECTING APPARATUS

(75) Inventors: Takayuki Yonemura, Suwa (JP); Tetsuya Isshiki, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 320 days.

(21) Appl. No.: 13/046,667

(22) Filed: Mar. 11, 2011

(65) Prior Publication Data

US 2011/0221830 A1    Sep. 15, 2011

(30) Foreign Application Priority Data

Mar. 12, 2010   (JP) .................................. 2010-056805
May 28, 2010   (JP) .................................. 2010-122799

(51) Int. Cl.
*B41J 2/015*    (2006.01)

(52) U.S. Cl.
USPC ............................................................... 347/68

(58) Field of Classification Search
None
See application file for complete search history.

(56) References Cited

U.S. PATENT DOCUMENTS

| | | | |
|---|---|---|---|
| 7,530,673 B2 | 5/2009 | Sumi | |
| 7,872,402 B2 | 1/2011 | Kobayashi et al. | |
| 7,985,348 B2 | 7/2011 | Tsukada et al. | |
| 8,231,803 B2 * | 7/2012 | Furukawa et al. | 252/62.9 PZ |
| 8,258,679 B2 | 9/2012 | Fukuoka | |
| 2008/0237530 A1 * | 10/2008 | Tsukada et al. | 252/62.9 PZ |
| 2011/0043574 A1 * | 2/2011 | Yonemura | 347/68 |
| 2011/0221830 A1 | 9/2011 | Yonemura et al. | |

FOREIGN PATENT DOCUMENTS

| | | | |
|---|---|---|---|
| CN | 85100426 A | * | 8/1986 |
| CN | 1911663 A | | 2/2007 |
| CN | 101578248 A | | 11/2009 |
| JP | 61-42815 A | | 3/1986 |
| JP | 2001-223404 A | | 8/2001 |
| JP | 2001223404 A | * | 8/2001 |
| JP | 2007-221066 A | | 8/2007 |
| JP | 2008-069051 A | | 3/2008 |
| JP | 2008069051 A | * | 3/2008 |
| JP | 2008-239388 A | | 10/2008 |
| JP | 2009-084126 A | | 4/2009 |
| JP | 2010-126421 A | | 6/2010 |
| JP | 2011-207204 A | | 10/2011 |

* cited by examiner

*Primary Examiner* — Matthew Luu
*Assistant Examiner* — Erica Lin
(74) *Attorney, Agent, or Firm* — Kilpatrick Townsend & Stockton LLP

(57) ABSTRACT

A liquid ejecting head comprises a pressure-generating chamber communicating with a nozzle opening and a piezoelectric element including a piezoelectric layer and electrodes. The piezoelectric layer is composed of a compound oxide having a perovskite structure and containing bismuth, ferrate, manganese, potassium and titanium.

6 Claims, 14 Drawing Sheets

LIQUID EJECTING HEAD AND LIQUID EJECTING APPARATUS

CROSS-REFERENCE TO RELATED APPLICATIONS

This application claims the benefit of priority to Japanese Patent Application No. 2010-056805 filed Mar. 12, 2010, and Japanese Patent Application No. 2010-122799 filed May 28, 2010 the contents of which are hereby incorporated by reference in their entirety.

BACKGROUND

1. Technical Field

The present invention relates to a liquid ejecting head including a piezoelectric element that causes a change in the pressure in a pressure-generating chamber communicating with a nozzle opening and that includes a piezoelectric layer and electrodes configured to apply a voltage to the piezoelectric layer, and a liquid ejecting apparatus including the liquid ejecting head.

2. Related Art

A known piezoelectric element used in a liquid ejecting head has a structure in which a piezoelectric layer composed of a piezoelectric material having an electromechanical conversion function, for example, a crystallized dielectric material is sandwiched between two electrodes. Such a piezoelectric element is mounted on a liquid ejecting head as an actuator device of a flexural oscillation mode, for example. A typical example of the liquid ejecting head is an ink jet recording head in which a part of a pressure-generating chamber communicating with a nozzle opening that ejects ink droplets is made up of a diaphragm, this diaphragm is deformed using a piezoelectric element to apply a pressure to ink in the pressure-generating chamber, thereby ejecting the ink as ink droplets from the nozzle opening.

A high piezoelectricity is required for piezoelectric materials used as a piezoelectric layer (piezoelectric ceramic) constituting such a piezoelectric element. A typical example of the piezoelectric materials is lead zirconate titanate (PZT) (refer to JP-A-2001-223404).

However, from the standpoint of environmental issues, there has been a requirement of a piezoelectric material having a reduced content of lead. As for a lead-free piezoelectric material, for example, JP-A-2008-069051 discloses piezoelectric ceramics having a chemical composition represented by $x[(Bi_aK_{1-a})TiO_3]-(1-x)[BiFeO_3]$ (wherein $0.3 \leq x \leq 0.8$ and $0.4 < a < 0.6$).

The piezoelectric ceramics described in JP-A-2008-069051 are so-called bulk ceramics having a film thickness of 0.1 mm. In the case where this material is formed into a thin film, it is difficult to use the material in a liquid ejecting head because of its low insulating property and large leakage current. This problem occurs not only in an ink jet recording head that ejects ink but also in other liquid ejecting heads that eject droplets of a liquid other than ink.

SUMMARY

An advantage of some aspects of the invention is to provide a liquid ejecting head which has a high insulating property, in which the generation of a leakage current can be suppressed and the burden on the environment is reduced, and a liquid ejecting apparatus including the liquid ejecting head.

According to a first aspect of the invention, a liquid ejecting head includes a pressure-generating chamber communicating with a nozzle opening; and a piezoelectric element including a piezoelectric layer and an electrode provided on the piezoelectric layer, wherein the piezoelectric layer is composed of a compound oxide having a perovskite structure and containing bismuth ferrate manganate and bismuth potassium titanate. According to the first aspect of the invention, a piezoelectric material composed of a compound oxide having a perovskite structure and containing bismuth ferrate manganate and bismuth potassium titanate is used as a piezoelectric layer. Consequently, a high insulating property can be achieved, and thus the generation of a leakage current can be suppressed. Furthermore, since the content of lead can be reduced, the burden on the environment can be reduced.

In this case, a molar ratio of the bismuth ferrate manganate to the bismuth potassium titanate, the ratio being represented by bismuth ferrate manganate/bismuth potassium titanate, is preferably 0.42 or more and 1.5 or less. Accordingly, it is possible to provide a piezoelectric material in which the generation of a leakage current is suppressed, and which has a high dielectric constant and a high piezoelectricity.

The piezoelectric layer is preferably a thin film having a thickness of 2 μm or less. In this case, a liquid ejecting head having a thin-film piezoelectric layer can be provided.

Furthermore, the piezoelectric layer preferably has a relative dielectric constant of 300 or more. In this case, a satisfactory piezoelectricity (amount of strain) can be obtained.

According to a second aspect of the invention, a liquid ejecting apparatus includes the liquid ejecting head according to the first aspect of the invention. According to the second aspect of the invention, since the liquid ejecting apparatus includes a liquid ejecting head which has a high insulating property and in which the generation of a leakage current can be suppressed, a liquid ejecting apparatus in which dielectric breakdown is prevented and which has a good reliability can be provided. In addition, since the liquid ejecting apparatus includes a liquid ejecting head including a piezoelectric material having a high dielectric constant and a high piezoelectricity, a liquid ejecting apparatus having a good liquid ejection capability can be provided.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

Figure 1:
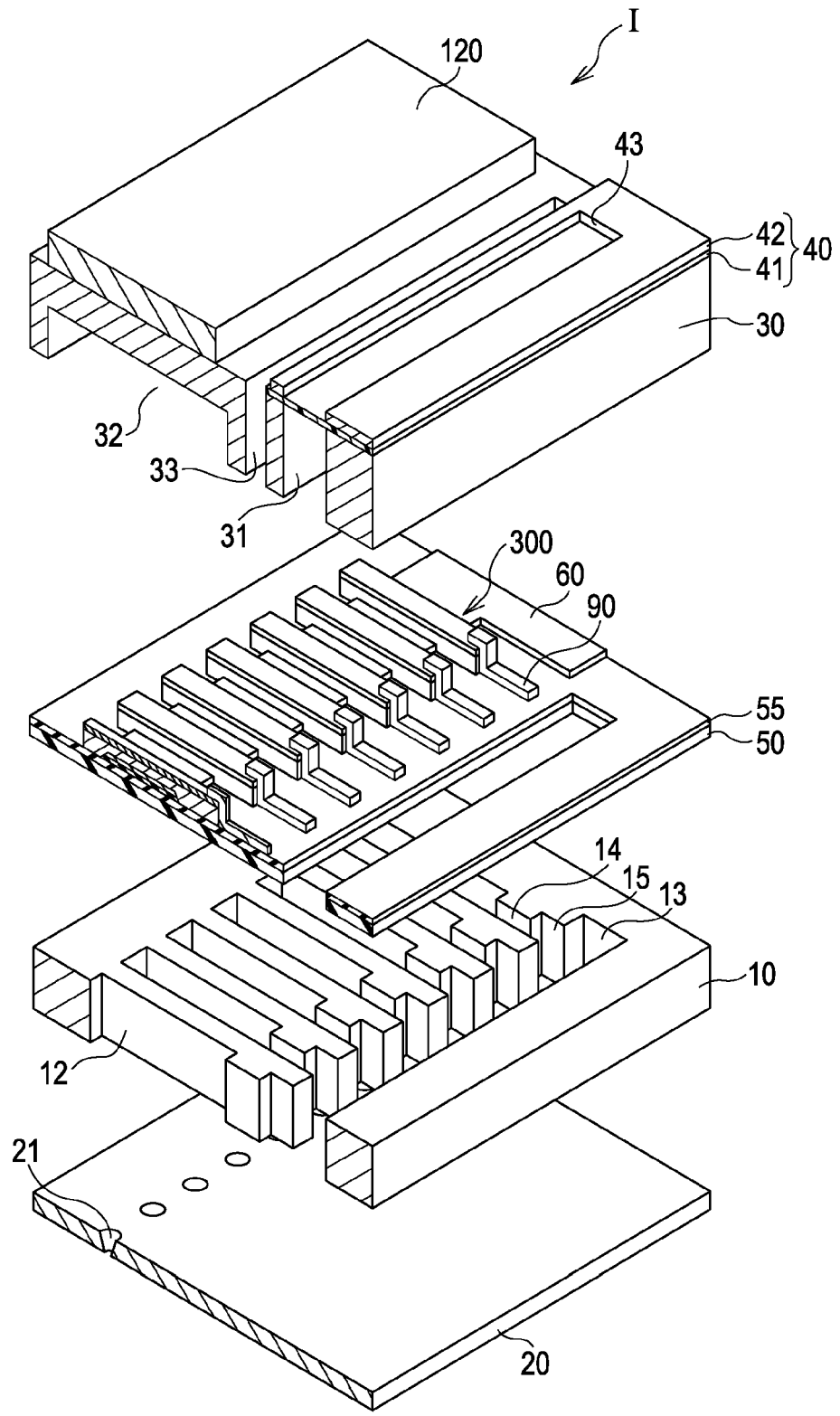
FIG. 1 is an exploded perspective view showing a schematic structure of a recording head according to a first embodiment.
Figure 2:
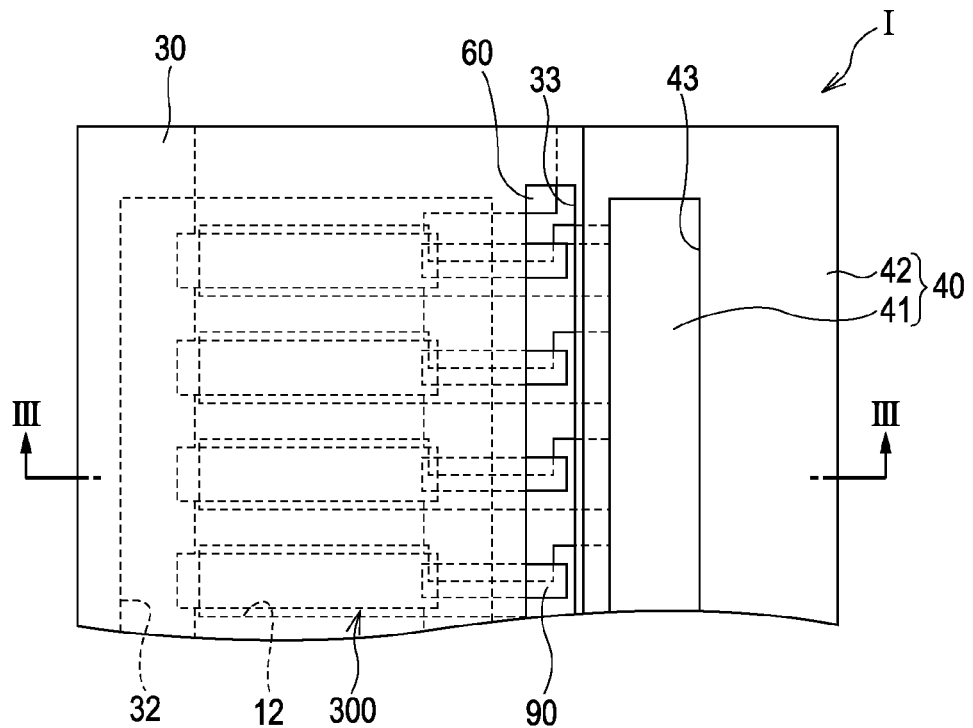
FIG. 2 is a plan view of the recording head according to the first embodiment.
Figure 3:
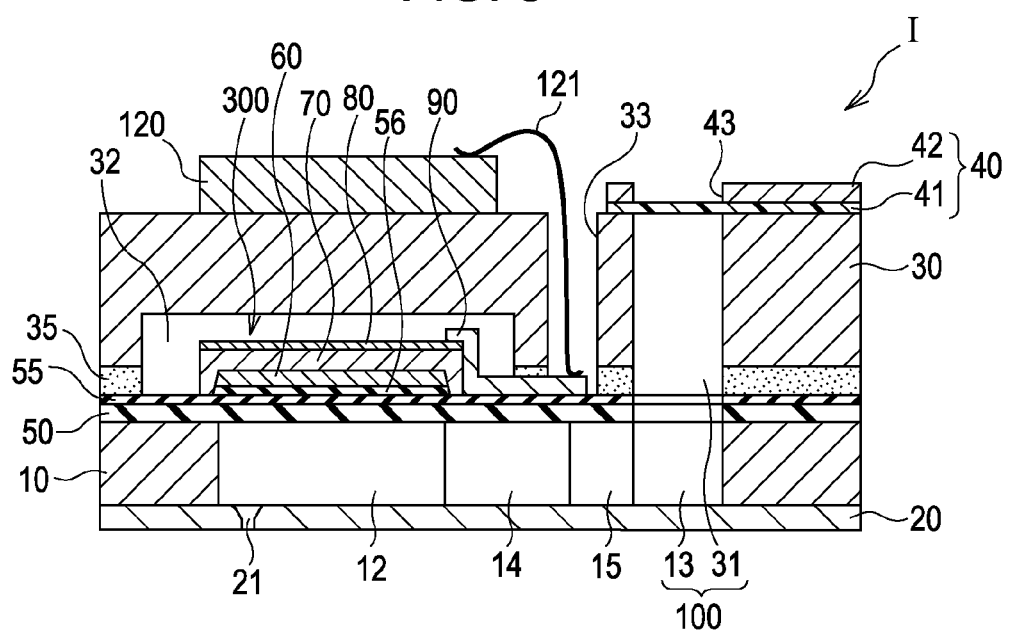
FIG. 3 is a cross-sectional view of the recording head according to the first embodiment.

FIG. 1 is an exploded perspective view showing a schematic structure of an ink jet recording head which is an example of a liquid electing head according to a first embodiment of the invention. FIG. 2 is a plan view of FIG. 1, and FIG. 3 is a cross-sectional view taken along line III-III in FIG. 2. As shown in FIGS. 1 to 3, a channel-forming substrate 10 of this embodiment is formed of a single-crystal silicon substrate, and an elastic film 50 composed of silicon dioxide is provided on one surface of the channel-forming substrate 10.

A plurality of pressure-generating chambers 12 are arranged in the channel-forming substrate 10 in the width direction of the channel-forming substrate 10. A communication section 13 is provided in an outside area of the longitudinal direction of the pressure-generating chambers 12 of the channel-forming substrate 10. The communication section 13 communicates with each of the pressure-generating chambers 12 through an ink supply channel 14 and a communicating channel 15 which are provided for each pressure-generating chamber 12. The communication section 13 communicates with a reservoir section 31 of a protective substrate described below and forms a part of a reservoir functioning as an ink chamber common to the pressure-generating chambers 12. The ink supply channels 14 are formed so as to have a width smaller than the width of the pressure-generating chambers 12, and maintain a channel resistance of ink, which is supplied from the communication section 13 to the pressure-generating chambers 12, to be constant. In this embodiment, the ink supply channel 14 is formed by reducing the width of a channel at one side. Alternatively, the ink supply channel 14 may be formed by reducing the width of a channel at both sides. Alternatively, an ink supply channel may be formed not by reducing the width of a channel but by reducing a dimension in the thickness direction. In this embodiment, the channel-forming substrate 10 includes a liquid channel composed of the pressure-generating chambers 12, the communication section 13, the ink supply channels 14, and the communicating channels 15.

A nozzle plate 20 is fixed on the opening surface side of the channel-forming substrate 10 with an adhesive, a heat-adhesive film, or the like therebetween. The nozzle plate 20 includes nozzle openings 21 each of which communicates with an end portion of the corresponding pressure-generating chamber 12, the end portion being located opposite the ink supply channel 14. The nozzle plate 20 is composed of, for example, a glass-ceramic material, a single-crystal silicon substrate, or a stainless steel.

As described above, the elastic film 50 is provided on a side opposite the opening surface of the channel-forming substrate 10. An insulating film 55 composed of, for example, zirconium oxide is provided on the elastic film 50. Furthermore, an adhesion layer 56 for improving the adhesiveness between the insulating film 55 and a first electrode 60, the adhesion layer 56 being composed of, for example, titanium oxide, is provided on the insulating film 55. Note that the elastic film 50, the insulating film 55, and the adhesion layer 56 may not be provided.

Furthermore, the first electrode 60, a piezoelectric layer 70 which is a thin film having a thickness of 2 µm or less, preferably in the range of 1 to 0.3 µm, and a second electrode 80 are stacked on the adhesion layer 56 to form a piezoelectric element 300. Herein, the piezoelectric element 300 refers to a portion including the first electrode 60, the piezoelectric layer 70, and the second electrode 80. In general, the piezoelectric element 300 is constituted by forming one of the electrodes of the piezoelectric element 300 as a common electrode, and patterning the other electrode and the piezoelectric layer 70 for each of the pressure-generating chambers 12. In this embodiment, the first electrode 60 is used as the common electrode of the piezoelectric element 300, and the second electrode 80 is used as an individual electrode of the piezoelectric element 300. However, these electrodes may be reversed on the grounds of a driving circuit or wiring. Furthermore, herein, a combination of the piezoelectric element 300 and a diaphragm in which a displacement is generated by the driving of the piezoelectric element 300 is referred to as "actuator device". In the example described above, the elastic film 50, the adhesion layer 56, the first electrode 60, and the insulating film 55, which is provided according to need, function as the diaphragm. However, the structure is not limited thereto. For example, the elastic film 50 etc. may not be provided. Alternatively, the piezoelectric element 300 itself may also substantially function as the diaphragm. The piezoelectric element 300 may be covered with a protective film composed of an insulating material having moisture resistance, such as aluminum oxide.

In the invention, the piezoelectric material constituting the piezoelectric layer 70 is a compound oxide having a perovskite structure and containing bismuth ferrate manganate (for example, $Bi(Fe,Mn)O_3$) and bismuth potassium titanate (for example, $(Bi,K)TiO_3$). In an A-site of the perovskite structure, i.e., the $ABO_3$ structure, oxygen is 12-coordinated, and in a B-site thereof, oxygen is 6-coordinated to form an octahedron. Bismuth (Bi) and potassium (K) are located in the A-site, and iron (Fe), manganese (Mn), and titanium (Ti) are located in the B-site. Specifically, the compound oxide having the perovskite structure and containing bismuth ferrate manganate and bismuth potassium titanate is a solid solution in which bismuth ferrate manganate and bismuth potassium titanate are uniformly solid-soluted. As for a ratio of bismuth ferrate manganate (BFM) to bismuth potassium titanate (BKT), the ratio BFM/BKT (molar ratio) is preferably 0.42 or more and 1.5 or less, and more preferably 0.82 or more and 1.5 or less.

When the piezoelectric material of the piezoelectric layer 70 is composed of the compound oxide having the perovskite structure and containing bismuth ferrate manganate and bismuth potassium titanate, the insulating property is increased, and the generation of a leakage current can be suppressed, as described in Examples below.

Such a piezoelectric layer 70 can have a relative dielectric constant at 25° C. of 300 or more and, furthermore, 500 or more, as described in Examples described below. Accordingly, a satisfactory piezoelectricity (amount of strain) can be obtained.

A lead electrode 90 extending from an end portion of the ink supply channel 14 side onto the insulating film 55, and composed of, for example, gold (Au) is connected to each second electrode 80 which is an individual electrode of the piezoelectric element 300.

A protective substrate 30 having the reservoir section 31 that constitutes at least a part of a reservoir 100 is bonded on the channel-forming substrate 10 on which the piezoelectric element 300 is formed, that is, above the first electrode 60 and on the insulating film 55, and the lead electrode 90 with an adhesive 35. In this embodiment, this reservoir section 31 is formed so as to penetrate through the protective substrate 30 in the thickness direction of the protective substrate 30 and to extend in the width direction of the pressure-generating chambers 12. As described above, the reservoir section 31 communicates with the communication section 13 of the channel-forming substrate 10 to form the reservoir 100 functioning as an ink chamber common to the pressure-generating chambers 12. Alternatively, the communication section 13 of the channel-forming substrate 10 may be divided into a plurality of sections for each of the pressure-generating chambers 12 so that only the reservoir section 31 may constitute a reservoir. Furthermore, for example, only the pressure-generating chambers 12 may be provided in the channel-forming substrate 10, and the ink supply channels 14 communicating the reservoir 100 and the respective pressure-generating chambers 12 may be provided in a component (e.g., the elastic film 50, the insulating film 55, and the like) interposed between the channel-forming substrate 10 and the protective substrate 30.

In addition, the protective substrate 30 has a piezoelectric element-holding section 32 that provides a space in which the movement of the piezoelectric elements 300 is not substantially disturbed, the piezoelectric element-holding section 32 being disposed in an area facing the piezoelectric elements 300. It is sufficient that the piezoelectric element-holding section 32 provides a space in which the movement of the piezoelectric elements 300 is not substantially disturbed. The space may be sealed or may not be sealed.

The protective substrate 30 is preferably composed of a material having a coefficient of thermal expansion substantially the same as that of the channel-forming substrate 10, for example, glass, a ceramic material, or the like. In this embodiment, the protective substrate 30 is formed of a single-crystal silicon substrate, which is the same material as the channel-forming substrate 10.

Furthermore, a through-hole 33 penetrating through the protective substrate 30 in the thickness direction is formed in the protective substrate 30. The end portion of the lead electrode 90 extending from each of the piezoelectric elements 300 is provided so as to be exposed in the through-hole 33.

A driving circuit 120 for driving the piezoelectric elements 300 arranged in parallel is fixed on the protective substrate 30. For example, a circuit substrate or a semiconductor integrated circuit (IC) can be used as the driving circuit 120. The driving circuit 120 is electrically connected to the lead electrode 90 with a connecting wire 121 therebetween, the connecting wire 121 being composed of an electrically conductive wire such as a bonding wire.

Furthermore, a compliance substrate 40 including a sealing film 41 and a fixing plate 42 is bonded on the protective substrate 30. The sealing film 41 is composed of a material having flexibility and a low rigidity. This sealing film 41 seals one surface of the reservoir section 31. The fixing plate 42 is composed of a relatively hard material. An area of the fixing plate 42 facing the reservoir 100 forms an opening 43 in which the fixing plate 42 is completely removed in the thickness direction thereof. Accordingly, the surface of the reservoir 100 is sealed by only the flexible sealing film 41.

In an ink jet recording head I of this embodiment, ink is introduced from an ink inlet connected to an external ink supply unit (not shown), and the inside of a space ranging from the reservoir 100 to the nozzle openings 21 is filled with the ink. Subsequently, a voltage is applied between the first electrode 60 and the second electrode 80 corresponding to each of the pressure-generating chambers 12 in accordance with a recording signal from the driving circuit 120 so that the elastic film 50, the adhesion layer 56, the first electrode 60, and the piezoelectric layer 70 are subjected to flexural deformation. As a result, the pressure in the respective pressure-generating chambers 12 increases to eject ink droplets from the nozzle openings 21.

Next, an example of a method for producing the ink jet recording head of this embodiment will be described with reference to FIGS. 4A to 8B. FIGS. 4A to 8B are each a cross-sectional view of a pressure-generating chamber in the longitudinal direction.

Figure 4A:
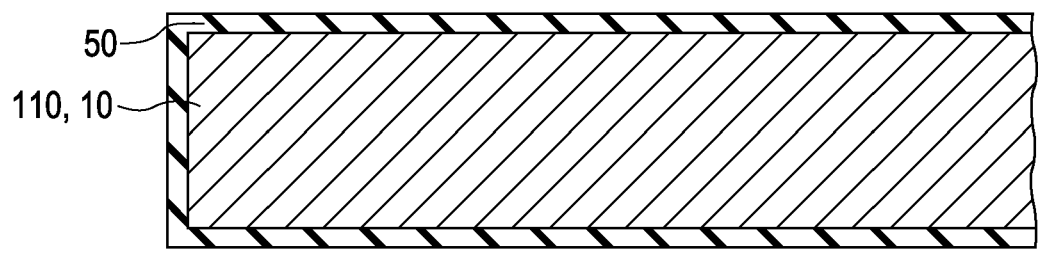
FIGS. 4A and 4B are cross-sectional views showing steps of producing the recording head according to the first embodiment.
Figure 4B:
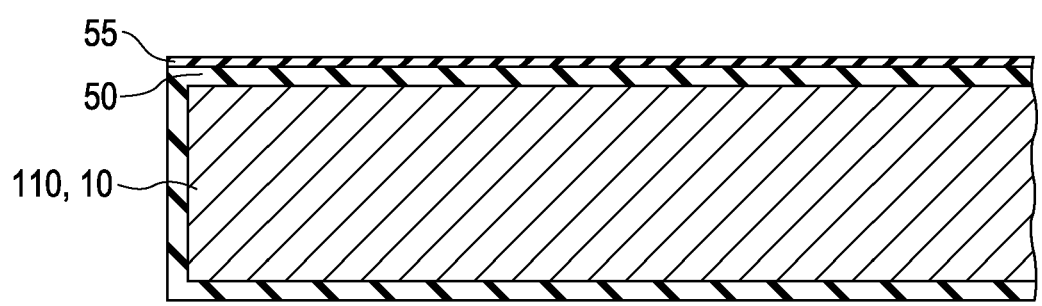

First, as shown in FIG. 4A, a silicon dioxide film composed of silicon dioxide ($SiO_2$) constituting an elastic film 50 and the like is formed on a surface of a wafer 110 for a channel-forming substrate, which is a silicon wafer, by thermal oxidation or the like. Next, as shown in FIG. 4B, an insulating film 55 composed of zirconium oxide is formed on the elastic film 50. Next, an adhesion layer 56 composed of, for example, titanium oxide is formed on the insulating film 55 by a reactive sputtering method, thermal oxidation, or the like.

Figure 5A:
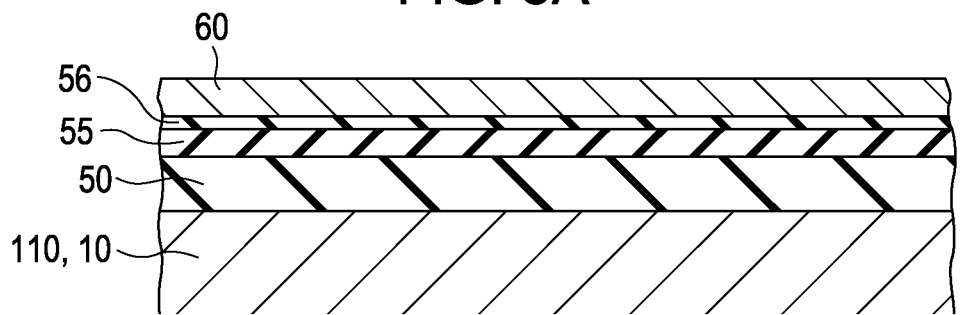
FIGS. 5A to 5C are cross-sectional views showing steps of producing the recording head according to the first embodiment.

Next, as shown in FIG. 5A, a first electrode 60 composed of, for example, platinum, iridium, iridium oxide, or a stacked structure thereof is formed over the entire surface of the adhesion layer 56 by a sputtering method or the like.

Next, a piezoelectric layer 70 is stacked on the first electrode 60. The method for forming the piezoelectric layer 70 is not particularly limited. For example, the piezoelectric layer 70 can be formed by using a metal-organic decomposition (MOD) method in which a piezoelectric layer 70 composed of a metal oxide is obtained by applying a solution prepared by dissolving or dispersing an complex in a solvent, drying the solution, and further performing baking at a high temperature, or a chemical solution method such as a sol-gel method. Alternatively, a laser ablation method, a sputtering method, a pulse laser deposition (PLD) method, a chemical vapor deposition (CVD) method, an aerosol deposition method, or the like may also be employed.

Figure 5B:
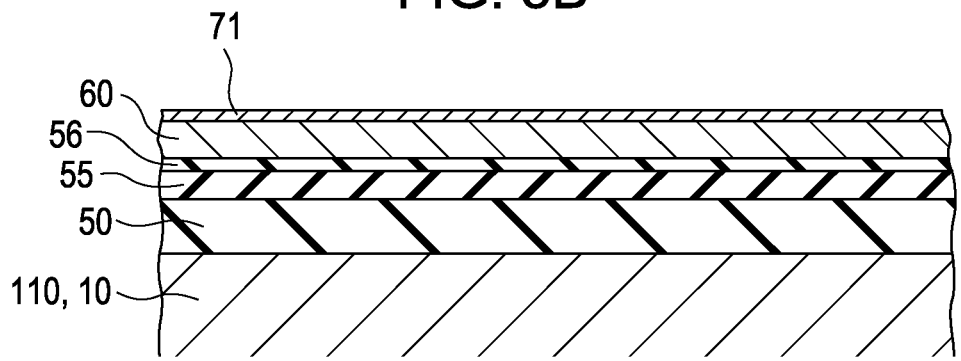

A specific example of a procedure for forming the piezoelectric layer 70 will be described. First, as shown in FIG. 5B, a sol or an MOD solution (precursor solution) containing complexes, specifically, complexes containing Bi, Fe, Mn, Ti, and K in a ratio that achieves a desired composition ratio is applied onto the first electrode 60 by a spin-coating method or the like to form a piezoelectric precursor film 71 (coating step).

The precursor solution applied is prepared by mixing complexes containing Bi, Fe, Mn, Ti, or K so that respective metals satisfy a desired molar ratio, and dissolving or dispersing the resulting mixture in an organic solvent such as an alcohol. Examples of the complexes containing Bi, Fe, Mn, Ti, or K that can be used include metal alkoxides, organic acid salts, and β-diketone complexes. An example of the complex containing Bi is bismuth 2-ethylhexanoate. An example of the complex containing Fe is iron 2-ethylhexanoate. An example of the complex containing Mn is manganese 2-ethylhexanoate. Examples of the complex containing Ti include titanium isopropoxide, titanium 2-ethylhexanoate, and titanium (di-i-propoxide)bis(acetylacetonate). Examples of the complex containing K include potassium 2-ethylhexanoate, potassium acetate, and potassium acetylacetonate.

Next, this piezoelectric precursor film 71 is heated to a certain temperature (for example, 100° C. to 200° C.), and dried for a certain period of time (drying step). Next, the dried piezoelectric precursor film 71 is degreased by heating to a certain temperature (for example, 350° C. to 450° C.) and maintained for a certain period of time (degreasing step). Herein, the term "degreasing" means that an organic component contained in the piezoelectric precursor film 71 is removed as, for example, $NO_2$, $CO_2$, and $H_2O$. The atmospheres in the drying step and the degreasing step are not limited, and these steps may be performed in air or in an inert gas.

Figure 5C:
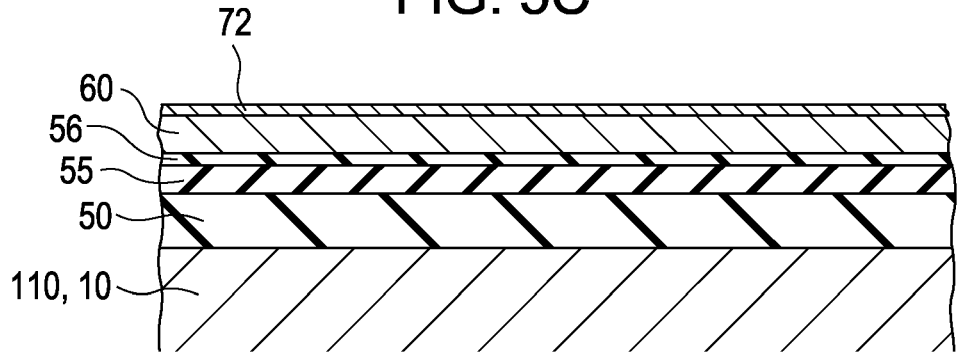

Next, as shown in FIG. 5C, the piezoelectric precursor film 71 is crystallized by heating to a certain temperature, for example, about 600° C. to 800° C. and maintaining for a certain period of time to form a piezoelectric film 72 (baking step). The atmosphere in this baking step is also not limited, and the baking step may be performed in air or in an inert gas.

Examples of a heating device used in the drying step, the degreasing step, and the baking step include a rapid thermal annealing (RTA) device with which heating is conducted by irradiation of an infrared lamp, and a hot plate.

Figure 6A:
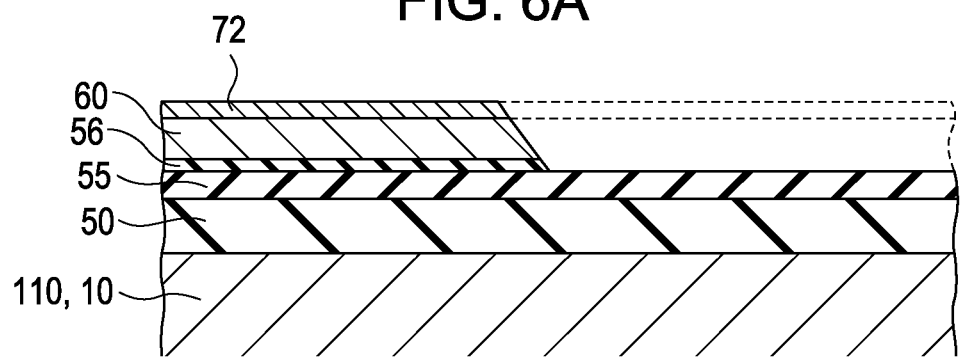
FIGS. 6A and 6B are cross-sectional views showing steps of producing the recording head according to the first embodiment.

Next, a resist (not shown) having a predetermined shape is formed on the piezoelectric film 72. As shown in FIG. 6A, for example, the first electrode 60 and a first layer of the piezoelectric film 72 are patterned at the same time using the resist as a mask so that side faces of the first electrode 60 and the first layer of the piezoelectric film 72 are slanted.

Figure 6B:
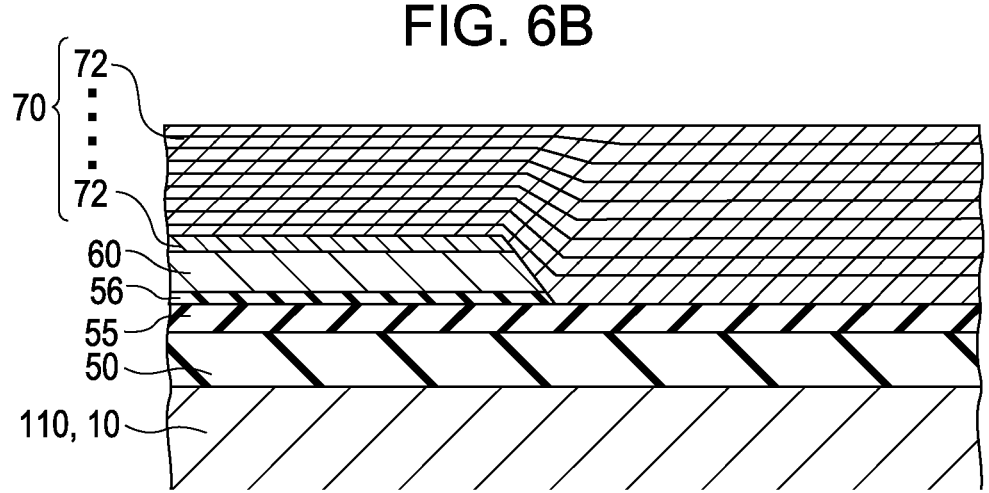

Next, after the resist is removed, the above-described coating step, drying step, and degreasing step or the above-described coating step, drying step, degreasing step, and baking step are repeated a plurality of times in accordance with a desired thickness or the like to form a piezoelectric layer 70 including a plurality of piezoelectric films 72. Thus, as shown in FIG. 6B, the piezoelectric layer 70 including a plurality of piezoelectric films 72 and having a certain thickness is formed. For example, when the film thickness of a coating solution per application is about 0.1 μm, for example, the thickness of the whole piezoelectric layer 70 including ten piezoelectric films 72 is about 1.1 μm. In this embodiment, a plurality of piezoelectric films 72 are stacked. Alternatively, only a single piezoelectric film 72 may be provided.

Figure 7A:
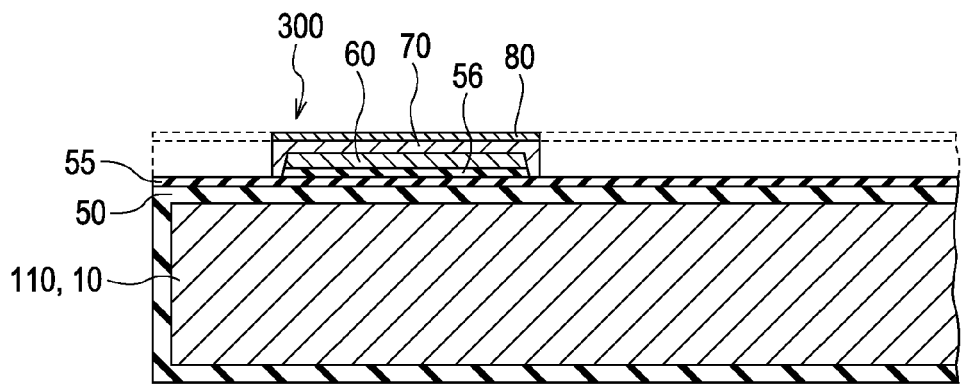
FIGS. 7A to 7C are cross-sectional views showing steps of producing the recording head according to the first embodiment.

After the piezoelectric layer 70 is formed in this manner, as shown in FIG. 7A, a second electrode 80 composed of, for example, platinum is formed on the piezoelectric layer 70 by a sputtering method or the like. The piezoelectric layer 70 and the second electrode 80 are patterned at the same time in an area facing each pressure-generating chamber 12 to form a piezoelectric element 300 including the first electrode 60, the piezoelectric layer 70, and the second electrode 80. Note that the patterning of the piezoelectric layer 70 and the second electrode 80 can be performed at one time by dry etching through a resist (not shown) formed so as to have a predetermined shape. Post-annealing may then be performed in a temperature range of 600° C. to 800° C. as needed. As a result, satisfactory interfaces can be formed between the piezoelectric layer 70 and the first electrode 60 and between the piezoelectric layer 70 and the second electrode 80, and in addition, crystallinity of the piezoelectric layer 70 can be improved.

Figure 7B:
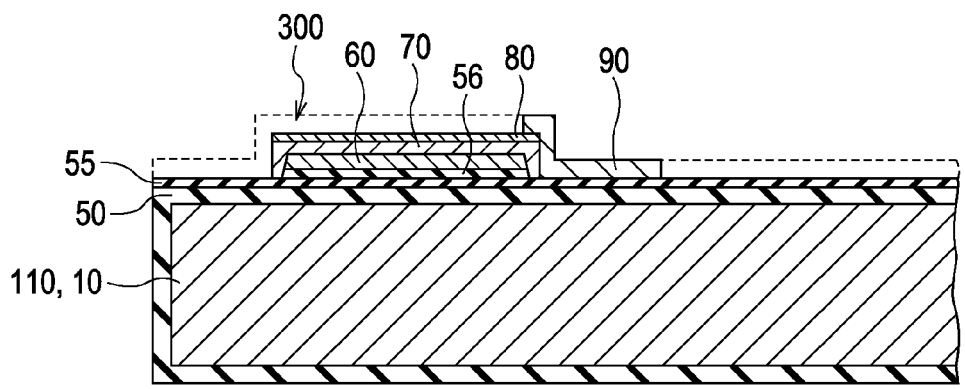

Next, as shown in FIG. 7B, a lead electrode 90 composed of, for example, gold (Au) is formed over the entire surface of the wafer 110 for a channel-forming substrate, and patterning is then performed for each piezoelectric element 300 through a mask pattern (not shown) composed of a resist or the like.

Figure 7C:
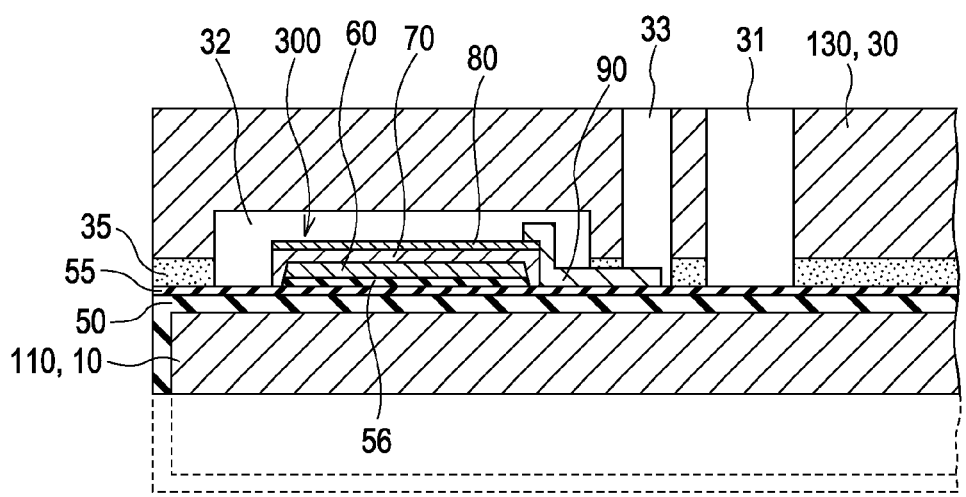

Next, as shown in FIG. 7C, a wafer 130 for a protective substrate, the wafer 130 being a silicon wafer and being formed into a plurality of protective substrates 30, is bonded to a surface of the wafer 110, the surface having the piezoelectric elements 300 thereon, with an adhesive 35 therebetween. Subsequently, the thickness of the wafer 110 is reduced to a certain value.

Figure 8A:
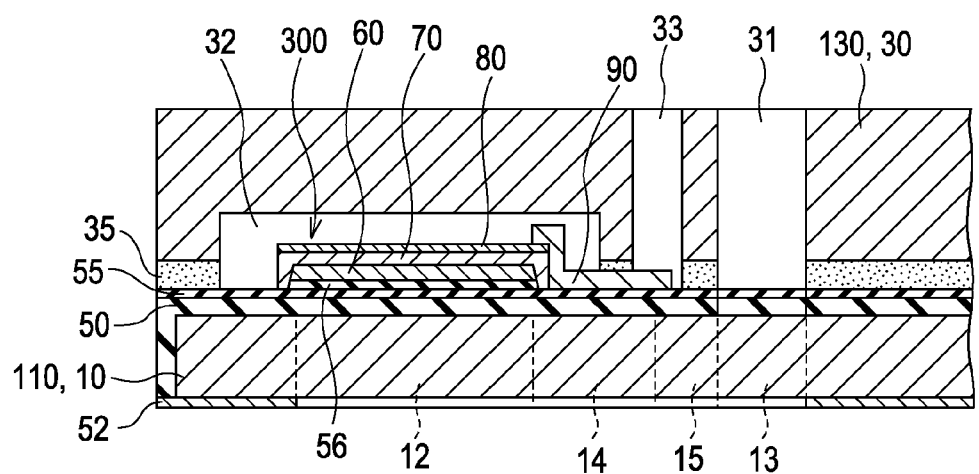
FIGS. 8A and 8B are cross-sectional views showing steps of producing the recording head according to the first embodiment.

Next, as shown in FIG. 8A, a mask film 52 is formed on the wafer 110 for a channel-forming substrate, and is patterned so as to have a predetermined shape.

Figure 8B:
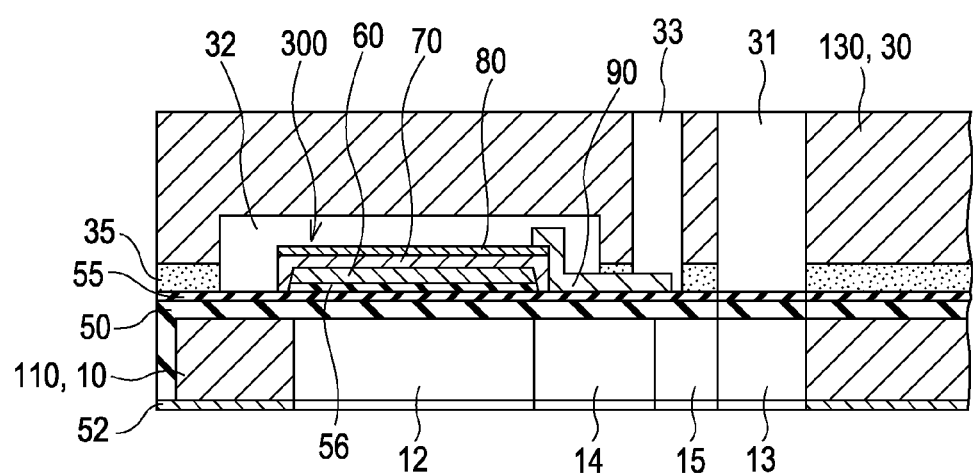

Next, as shown in FIG. 8B, anisotropic etching (wet etching) of the wafer 110 is performed using an alkaline solution such as a potassium hydroxide (KOH) solution through the mask film 52, thereby forming a pressure-generating chamber 12, a communication section 13, an ink supply channel 14, a communicating channel 15, etc. corresponding to each piezoelectric element 300.

Next, unnecessary portions of the outer peripheries of the wafer 110 for a channel-forming substrate and the wafer 130 for a protective substrate are removed by, for example, cutting by dicing or the like. The mask film 52 provided on a surface of the wafer 110, the surface being located opposite the wafer 130, is removed. A nozzle plate 20 in which nozzle openings 21 are formed is then bonded to the surface, and a compliance substrate 40 is bonded to the wafer 130. The wafer 110 and other components are then divided into a channel-forming substrate 10 etc. having a size of one chip, as shown in FIG. 1. Thus, the ink jet recording head I of this embodiment is produced.

EXAMPLES

The invention will now be described more specifically by way of Examples. It should be noted that the invention is not limited to Examples below.

Example 1

First, a silicon dioxide film having a thickness of 1,070 nm was formed on a surface of a silicon substrate oriented in the (100) direction by thermal oxidation. Next, a titanium film having a thickness of 40 nm was formed on the silicon dioxide film by an RF sputtering method. The titanium film was thermally oxidized to form a titanium oxide film. Next, a platinum film having a thickness of 130 nm was formed on the titanium oxide film by a DC sputtering method, thus forming a first electrode oriented in the (111) direction.

Subsequently, a piezoelectric layer was formed on the first electrode by a spin-coating method. The method for forming the piezoelectric layer was as follows. First, xylene, octane, and butanol solutions of Bi, K, Fe, Mn, and Ti were mixed in a predetermined ratio to prepare a precursor solution. This precursor solution was dropped on the substrate having the titanium oxide film and the first electrode thereon, and the substrate was rotated at 3,000 rpm to form a piezoelectric precursor film (coating step). Next, drying and degreasing were conducted at 150° C. for two minutes and at 400° C. for four minutes, respectively (drying and degreasing steps). These coating step and drying and degreasing steps were repeated three times, and baking was then conducted at 650° C. for five minutes by rapid thermal annealing (RTA). This step in which the coating step and the drying and degreasing steps were repeated three times and the baking step was then conducted at one time was repeated three times. Thus, a piezoelectric layer having a total thickness of 900 nm was formed by performing the coating total nine times.

Subsequently, a platinum film having a thickness of 100 nm was formed as a second electrode on the piezoelectric layer by a DC sputtering method, and baking was then conducted at 650° C. for five minutes using RTA, thus forming a piezoelectric element including the piezoelectric layer composed of a compound oxide having a perovskite structure and containing $Bi(Fe_{0.97},Mn_{0.03})O_3$ and $(Bi_{0.5},K_{0.5})TiO_3$ in which a molar ratio bismuth ferrate manganate/bismuth potassium titanate, i.e., $Bi(Fe_{0.97},Mn_{0.03})O_3/(Bi_{0.5},K_{0.5})TiO_3$ was 1.50.

Examples 2 to 6

Piezoelectric elements were formed as in Example 1 except that the mixing ratio of the xylene, octane, and butanol solutions of Bi, K, Fe, Mn, and Ti was changed, and compound oxides having a perovskite structure and containing bismuth ferrate manganate and bismuth potassium titanate in which a ratio bismuth ferrate manganate/bismuth potassium titanate (molar ratio) was that shown in Table 1 were used as the piezoelectric layer 70.

TABLE 1

| | Bismuth ferrate manganate/bismuth potassium titanate (molar ratio) |
|---|---|
| Example 1 | 1.50 |
| Example 2 | 1.22 |
| Example 3 | 1.00 |
| Example 4 | 0.82 |
| Example 5 | 0.67 |
| Example 6 | 0.43 |

Example 7

First, a silicon dioxide film having a thickness of 1,070 nm was formed on a surface of a silicon substrate oriented in the (100) direction by thermal oxidation. Next, a zirconium film was formed on the silicon dioxide film by a sputtering method. The zirconium film was thermally oxidized to form a zirconium oxide film having a thickness of 400 nm. Next, a titanium film having a thickness of 400 nm was formed on the zirconium oxide film by an RF sputtering method. The titanium film was thermally oxidized to form a titanium oxide film. Next, a platinum film having a thickness of 130 nm and oriented in the (111) direction was formed on the titanium oxide film by a DC sputtering method. Next, a photoresist having a predetermined shape was formed on the platinum film, and patterning was then conducted by dry etching. Thus, a first electrode was formed.

Subsequently, a piezoelectric layer was formed on the first electrode by a spin-coating method. The method for forming the piezoelectric layer was as follows. First, xylene, octane, and butanol solutions of Bi, K, Fe, Mn, and Ti were mixed in a predetermined ratio to prepare a precursor solution. This precursor solution was dropped on the substrate having the zirconium oxide film, the titanium oxide film, and the first electrode thereon, and the substrate was rotated at 3,000 rpm to form a piezoelectric precursor film (coating step). Next, drying and degreasing were conducted at 150° C. for two minutes and at 400° C. for four minutes, respectively (drying and degreasing steps). These coating step and drying and degreasing steps were repeated three times, and baking was then conducted at 750° C. for five minutes by rapid thermal annealing (RTA). This step in which the coating step and the drying and degreasing steps were repeated three times and the baking step was then conducted at one time was repeated three times. Thus, a piezoelectric layer having a total thickness of 900 nm was formed by performing the coating total nine times.

Subsequently, a platinum film having a thickness of 100 nm was formed on the piezoelectric layer by a DC sputtering method. Next, heat treatment was conducted at 750° C. for five minutes by RTA. Next, a photoresist having a predetermined shape was formed on the platinum film, and the platinum film and the piezoelectric layer were patterned by dry etching. Subsequently, an aluminum oxide film was formed by a sputtering method. Next, a photoresist having a predetermined shape was formed, and patterning was then conducted twice by dry etching. Thus, the aluminum oxide film was processed so as to have a predetermined shape.

Next, the upper portion of the processed substrate was protected by an organic film, and the lower portion of the substrate was processed so as to have a predetermined thickness with a grinder, and the ground surface was then polished. Next, an alkali-resistant hard mask was formed, and patterned so as to have a predetermined shape. Next, silicon was processed so as to have the predetermined shape by wet etching. Subsequently, the organic film was detached to prepare a piezoelectric actuator including a piezoelectric element and a pressure-generating chamber. The piezoelectric layer was composed of a compound oxide having a perovskite structure and containing $Bi(Fe_{0.97},Mn_{0.03})O_3$ and $(Bi_{0.5},K_{0.5})TiO_3$ in which the molar ratio bismuth ferrate manganate/bismuth potassium titanate, i.e., $Bi(Fe_{0.97},Mn_{0.03})O_3/(Bi_{0.5},K_{0.5})TiO_3$ was 1.22.

Comparative Example 1

A ceramic was prepared by a solid-phase method using solid powders of bismuth oxide, iron oxide, potassium carbonate, and titanium oxide as raw materials. The method was as follows. First, the above raw materials were mixed so that a molar ratio Bi:Fe:K:Ti was 70:40:30:60. Ethanol and zirconia balls were then added thereto in an amount equivalent to the amount of mixed powder and in an amount four times the amount of raw materials, respectively. Mixing and pulverization were conducted for 24 hours. Subsequently, the zirconia balls were removed, and drying was then conducted. Thus, a mixed powder was obtained. This mixed powder was heated in an electric furnace to 700° C. to obtain a calcined powder. Next, 2.5% by weight of polyvinyl alcohol (PVA) was added as a binder to the calcined powder, and a pellet having a diameter of 1 mm was then prepared by press molding. The pellet was covered with the calcined powder. A debinding process was conducted at 700° C., and firing was then conducted at 1,060° C. to obtain a ceramic pellet. After the pellet was polished, a sliver electrode was applied thereto by screen printing, and was baked at 700° C. Thus, a ceramic including the electrode was obtained.

Test Example 1

For each of the piezoelectric elements of Examples 1 to 6, a powder X-ray diffraction pattern of the piezoelectric layer was determined at room temperature (25° C.) with a D8 Discover X-ray diffractometer manufactured by Bruker AXS using CuKα-rays as an X-ray source. As a result, only peaks attributable to the $ABO_3$ structure and peaks attributable to the substrate were observed in all Examples 1 to 6, and no heterogeneous phase was observed.

Test Example 2

Figure 9:
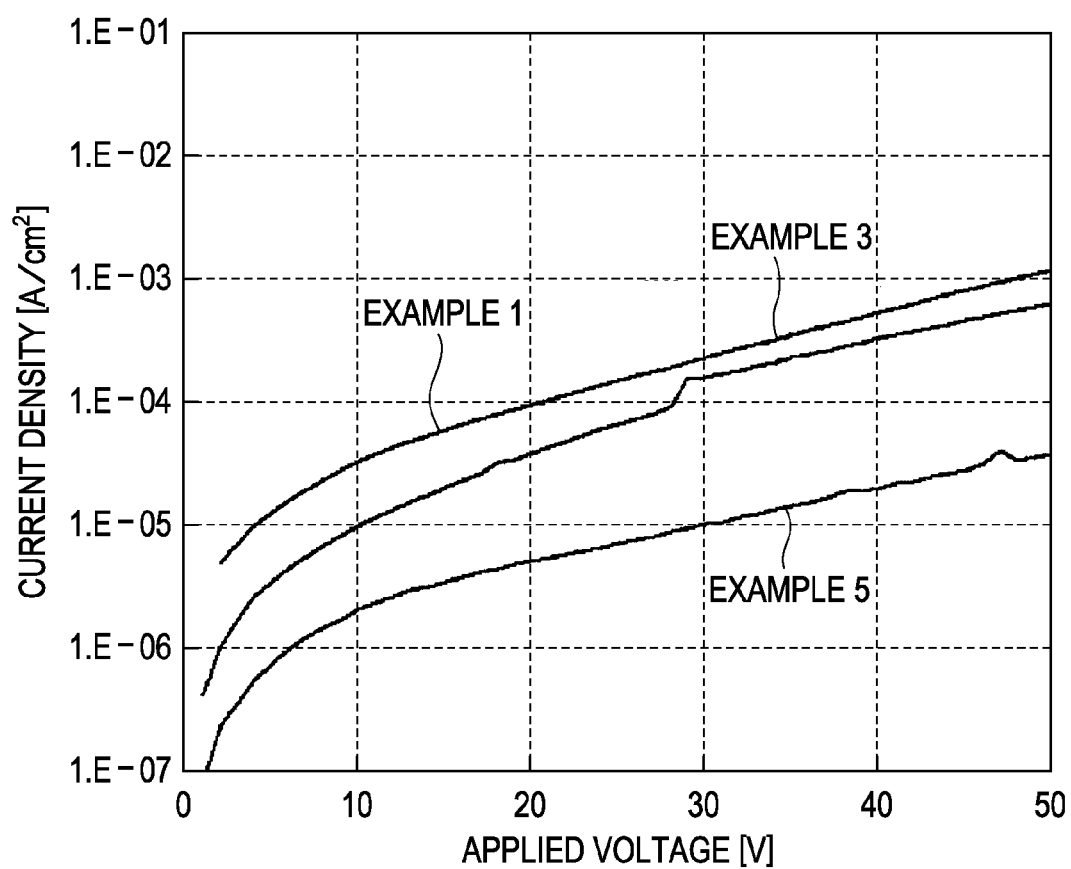
FIG. 9 is a graph showing J-E curves of Examples 1, 3, and 5.

For each of the piezoelectric elements of Examples 1 to 6, a J-E curve was measured at room temperature (25° C.) using a 4140B pA meter/DC voltage source manufactured by Hewlett-Packard Development Company. The measurement was conducted using an electrode pattern having a diameter φ of 300 μm. According to the results, it was found that the current density was small, and the leakage was suppressed in all Examples. As examples of the results, the results of Examples 1, 3, and 5 are shown in FIG. 9.

Test Example 3

Figure 10A:
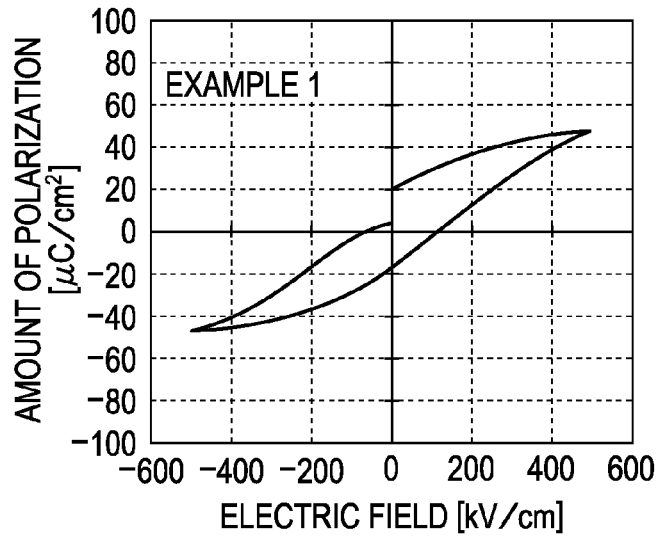
FIGS. 10A to 10C are graphs showing P-E curves of Examples 1, 3, and 5, respectively.
Figure 10B:
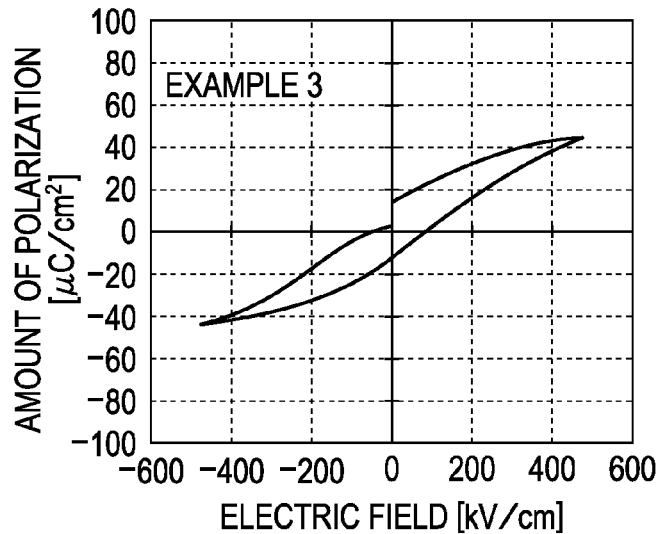
Figure 10C:
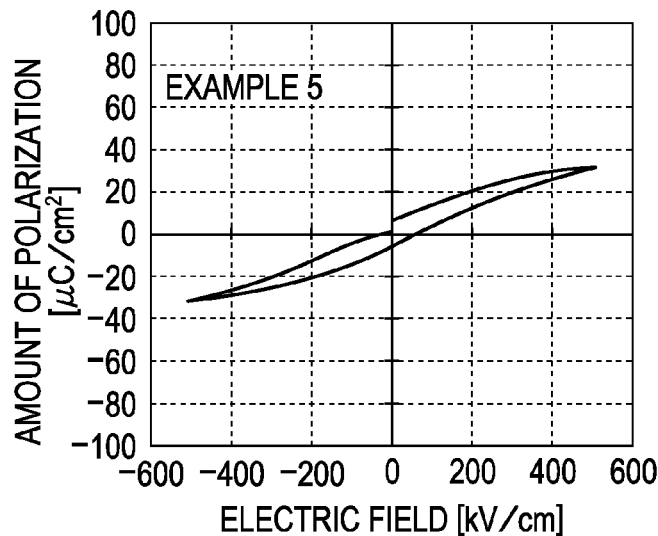

For each of the piezoelectric elements of Examples 1 to 6, the relationship between the amount of polarization and the electric field (P-E curve) was determined at room temperature (25° C.) at a frequency of 1 kHz with an FCE-1A ferroelectric characteristic evaluation system manufactured by TOYO Corporation using an electrode pattern having a diameter φ of 400 μm. According to the results, a satisfactory hysteresis due to ferroelectricity was shown in all Examples. As examples of the results, the result of Example 1 is shown in FIG. 10A, the result of Example 3 is shown in FIG. 10B, and the result of Example 5 is shown in FIG. 10C.

Figure 11:
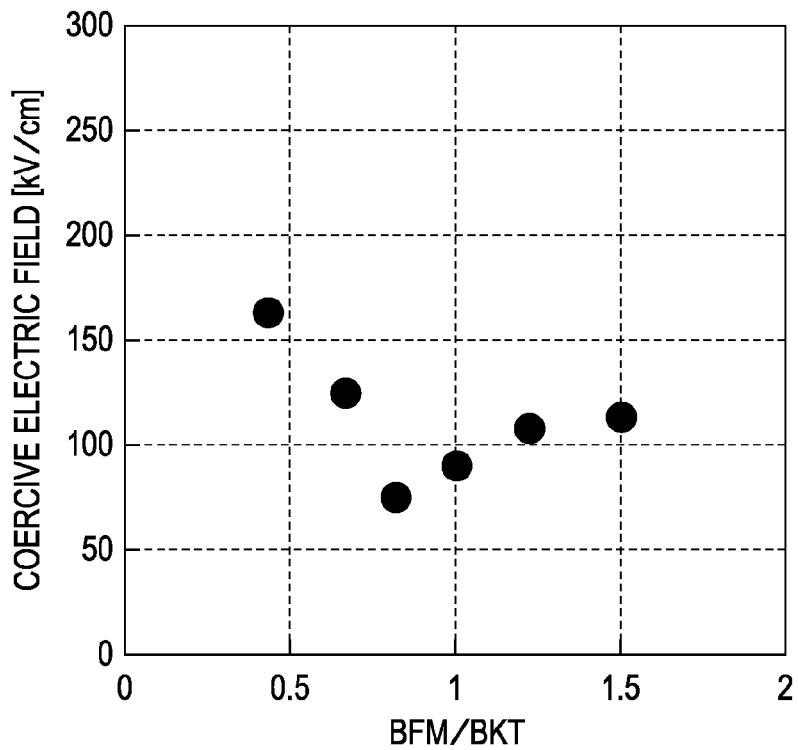
FIG. 11 is a coercive electric field-composition plot of Examples 1 to 6.

Furthermore, for each of the piezoelectric elements of Examples 1 to 6, the coercive electric field $E_c$ was determined from the relationship between the amount of polarization and the electric field (P-E curve) in Test Example 3. FIG. 11 shows a graph showing the relationship between a ratio bismuth ferrate manganate/bismuth potassium titanate (molar ratio) and the coercive electric field $E_c$. As shown in FIG. 11, in all Examples 1 to 6, the coercive electric field $E_c$ was less than 164 kVcm$^{-1}$. Accordingly, when a voltage that provides an electric field of 164 kVcm$^{-1}$ or more is applied, an ink jet recording head can be driven. For example, since the coercive electric field $E_c$ is less than 200 kVcm$^{-1}$, in a case of a thin film having a thickness of 1 μm, polarization can be caused at a voltage (intermediate potential) of 20 V and an ink jet recording head can be driven. In addition, the coercive electric field $E_c$ is less than 100 kVcm$^{-1}$ in Examples 3 and 4. Accordingly, when the piezoelectric element has a composition substantially the same as that of these Examples, even in a thin film having a thickness of 2 μm, polarization can be caused at an intermediate potential of 20 V. The coercive electric field in Examples was higher than that in Comparative Example 1. However, this is a phenomenon that the coercive electric field is increased in a case of a thin film in accordance with factors of the interface, stress, crystallinity, and the like, and this phenomenon is particular to a thin film.

Test Example 4

Figure 12:
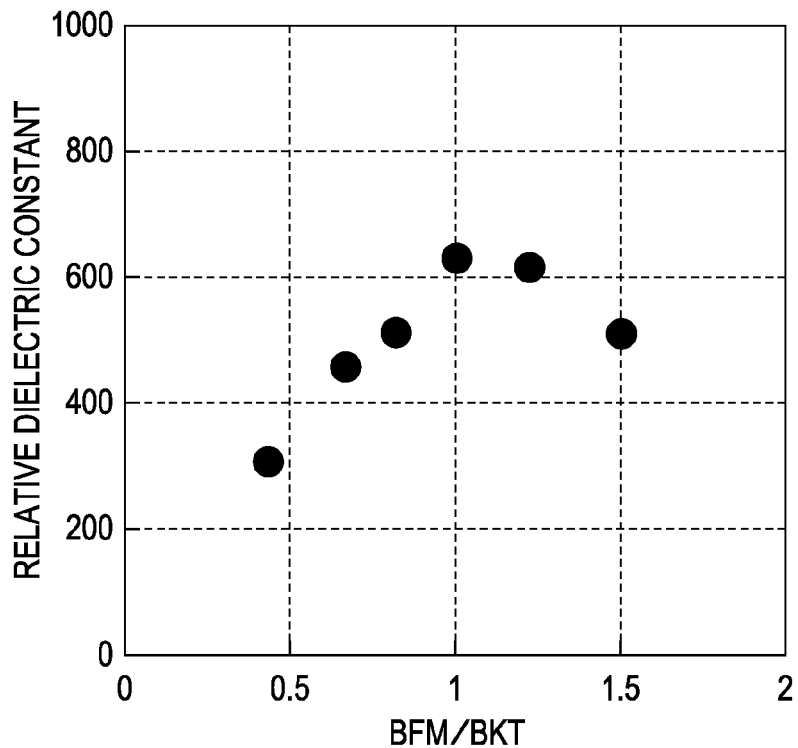
FIG. 12 is a relative dielectric constant-composition plot of Examples 1 to 6.

For each of the piezoelectric elements of Examples 1 to 6, the relative dielectric constant of the piezoelectric layer was measured with a 4294A impedance analyzer manufactured by Hewlett-Packard Development Company at room temperature (25° C.) at a frequency of 1 kHz using an electrode pattern having a diameter φ of 500 μm. FIG. 12 is a graph showing the relationship between the ratio bismuth ferrate manganate/bismuth potassium titanate (molar ratio) and the relative dielectric constant $\in_r$. According to the results, as shown in FIG. 12, the relative dielectric constant was high; 300 or more. In Examples 1 to 4, the relative dielectric constant was 500 or more. In addition, the relative dielectric constant has a maximum with respect to the composition ratio. When the ratio BFM/BKT was 1.11 (Example 2), the relative dielectric constant $\in_r$ was as high as 616. When the BFM/BKT was 1.00 (Example 3), the relative dielectric constant $\in_r$ was as high as 628. These values are relative dielectric constants three times or more the relative dielectric constant of bismuth ferrate (BFO).

Test Example 5

Figure 13:
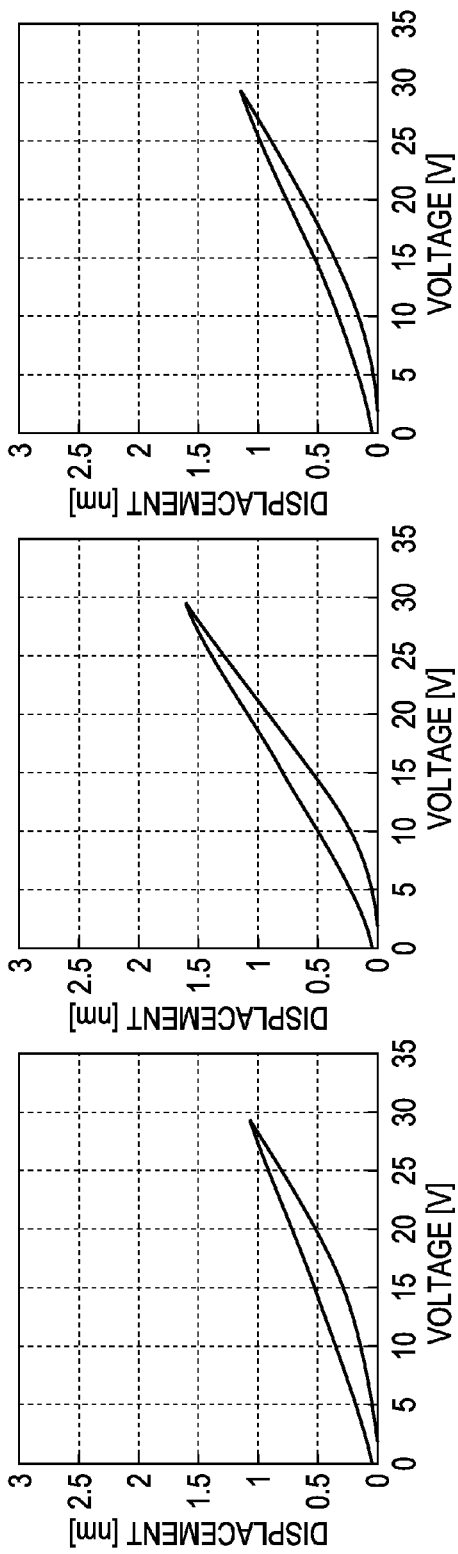
FIGS. 13A to 13F are graphs showing S-V curves of Examples 1 to 6, respectively.

For each of the piezoelectric elements of Examples 1 to 6, the relationship between the electric-field-induced strain and the voltage was determined with a displacement measuring apparatus (DBLI) manufactured by aixACCT by applying a voltage with a frequency of 1 kHz at room temperature (25° C.) using an electrode pattern having a diameter φ of 500 μm. The result of Example 1 is shown in FIG. 13A, the result of Example 2 is shown in FIG. 13B, the result of Example 3 is shown in FIG. 13C, the result of Example 4 is shown in FIG. 13D, the result of Example 5 is shown in FIG. 13E, and the result of Example 6 is shown in FIG. 13F. According to these results, as shown in FIGS. 13A to 13F, the displacement satisfactorily occurred in all Examples.

Figure 14:
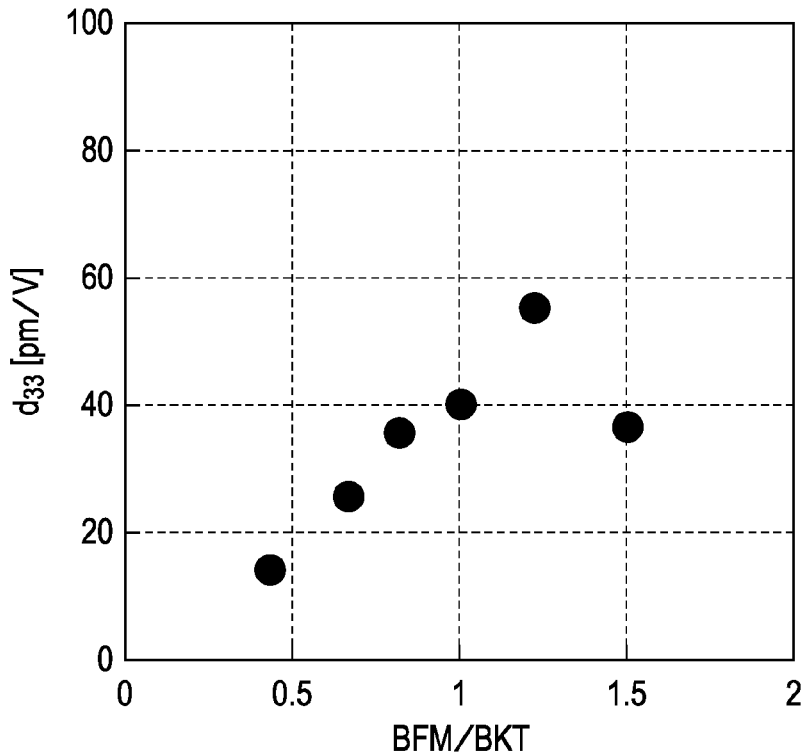
FIG. 14 is a piezoelectric constant-composition plot of Examples 1 to 6.

On the basis of the measurement results shown in FIGS. 13A to 13F, a piezoelectric constant $d_{33}$ was determined by dividing a maximum piezoelectric strain $S_{max}$ by a maximum applied electric field $E_{max}$ ($S_{max}/E_{max}$). FIG. 14 shows the relationship between the ratio bismuth ferrate manganate/bismuth potassium titanate (molar ratio) and the piezoelectric constant $d_{33}$. Referring to FIG. 14, the piezoelectric constant $d_{33}$ has a maximum with respect to the composition ratio. When the ratio BFM/BKT was 1.11 (Example 2), the piezoelectric constant $d_{33}$ was 55 pmV$^{-1}$. When the BFM/BKT was 1.00 (Example 3), the piezoelectric constant $d_{33}$ was 40 pmV$^{-1}$. Thus, the maximum of the piezoelectric constant $d_{33}$ showed a similar tendency to the maximum of the dielectric constant in Test Example 4. These results show that the increase in the dielectric constant corresponds to the improvement of the piezoelectricity.

Test Example 6

Figure 15:
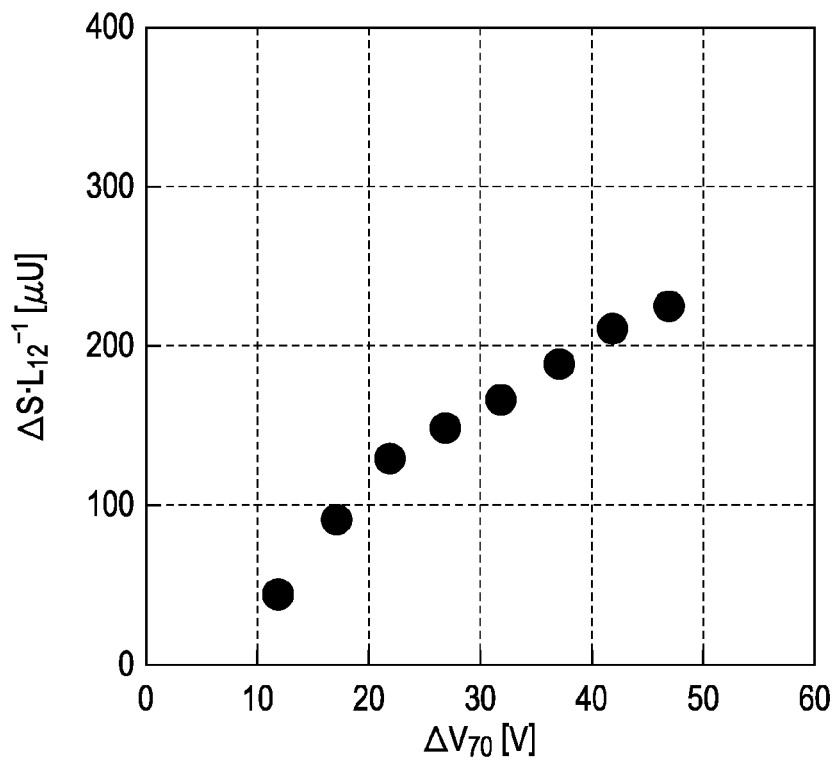
FIG. 15 is a $\Delta S/L_{12}$-$\Delta V_{70}$ plot of Example 7.

A maximum variation width ΔS of relative positions of the elastic film 50, the insulating film 55, the adhesion layer 56, the first electrode 60, the piezoelectric layer 70, the second electrode 80, and the protective film (aluminum oxide film), the maximum variation width ΔS being generated when a potential difference $\Delta V_{70}$ was applied to the piezoelectric layer 70 of Example 7, was measured with a laser Doppler displacement meter at room temperature (25° C.). FIG. 15 shows the measurements results obtained when the applied voltage was changed. The vertical axis represents a value ($\Delta S/L_{12}$) calculated by dividing the maximum variation width ΔS by a length $L_{12}$ of the pressure-generating chamber 12 in the longitudinal direction. This value $\Delta S/L_{12}$ represents the amount of deformation of the pressure-generating chamber 12 per unit length generated when a voltage is applied. More specifically, the value $\Delta S/L_{12}$ corresponds to a liquid ejection capability of the head. Since this value $\Delta S/L_{12}$ is a dimensionless number, U is used as the system of units as a matter of form.

Referring to FIG. 15, when the potential difference $\Delta V_{70}$ was 20 V, the value $\Delta S/L_{12}$ was about 100 μU, and when the potential difference $\Delta V_{70}$ was 40 V, the value $\Delta S/L_{12}$ was about 200 μU. Thus, it was found that the piezoelectric actuator of Example 7 had satisfactory actuator characteristics. In addition, the piezoelectric actuator of Example 7 showed a satisfactory linear response with respect to the applied voltage when the potential difference $\Delta V_{70}$ was in the range of 20 to 50 V. Accordingly, it was found that a multi-size dot technology (MSDT) (i.e., a control of the droplet diameter of a liquid to be ejected) using a waveform of an applied voltage can be easily performed.

Test Example 7

Figure 16:
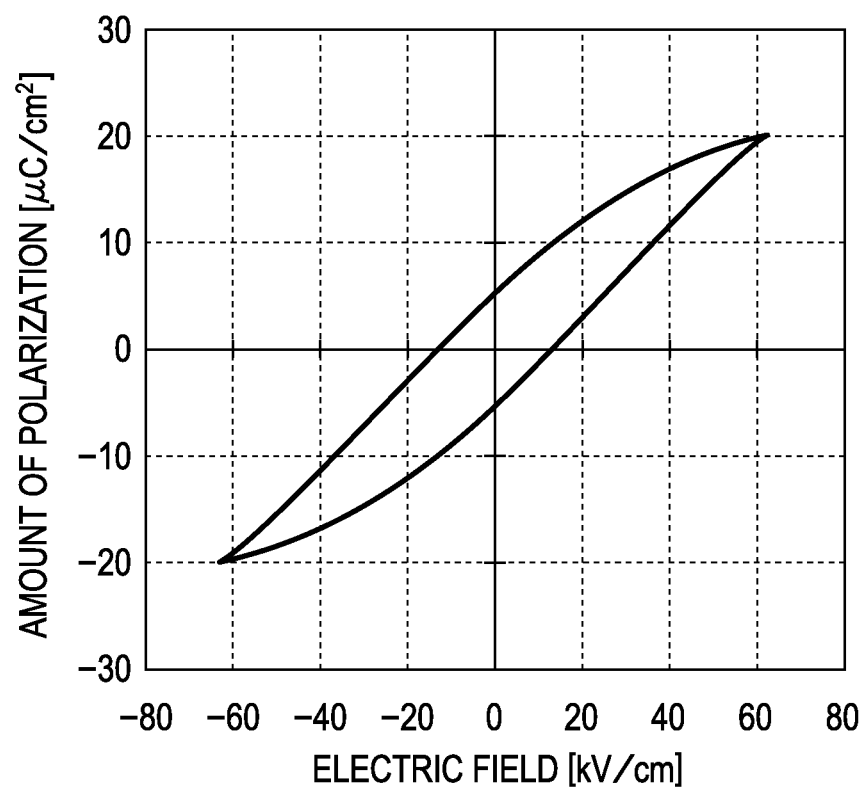
FIG. 16 is a graph showing a P-E curve of Comparative Example 1.

For the ceramic of Comparative Example 1, the relationship between the amount of polarization and the electric field (P-E curve) was determined by measuring with an FCE-1A ferroelectric characteristic evaluation system manufactured by TOYO Corporation in silicone oil at room temperature at a frequency of 10 kHz. The result is shown in FIG. 16. As shown in FIG. 16, a satisfactory hysteresis due to ferroelectricity was observed. The coercive electric field $E_c$ was 14 kVcm$^{-1}$.

Furthermore, a polarization treatment of the ceramic of Comparative Example 1 was conducted in silicone oil at room temperature by applying a direct electric field of 50 kVcm$^{-1}$ for three minutes. Note that the electric field used in this polarization treatment was an electric field that is sufficient for the polarization treatment in accordance with the P-E curve of FIG. 16.

Piezoelectric characteristics of this ceramic of Comparative Example 1 that had been subjected to the polarization treatment were evaluated on the basis of a piezoelectric constant ($d_{33}$) in the polarization direction using a piezo-$d_{33}$ meter produced by the Chinese Academy of Sciences. The measurement was conducted at room temperature. The piezo-$d_{33}$ meter produced by the Chinese Academy of Sciences is a device for measuring a piezoelectric constant by measuring the amount of polarization induced by the pressure. According to the result, the piezoelectric constant $d_{33}$ of Comparative Example 1 was 36 pCN$^{-1}$. This is a value of about ⅕ of the piezoelectric constant determined from the strain induced by application of a voltage in JP-A-2008-069051. This result showed that the commonly used polarization treatment could not maintain the polarization of the ceramic of Comparative Example 1. Accordingly, it was found that it is difficult to use the ceramic of Comparative Example 1 in an ink jet recording head.

Other Embodiments

Embodiments of the invention have been described, but the basic configuration of the invention is not limited to the configuration described above. For example, in the embodiments described above, a single-crystal silicon substrate was exemplified as the channel-forming substrate 10. However, the channel-forming substrate 10 is not particularly limited to this. Alternatively, for example, a silicon-on-insulator (SOI) substrate, or another material such as glass may also be used.

Figure 17:
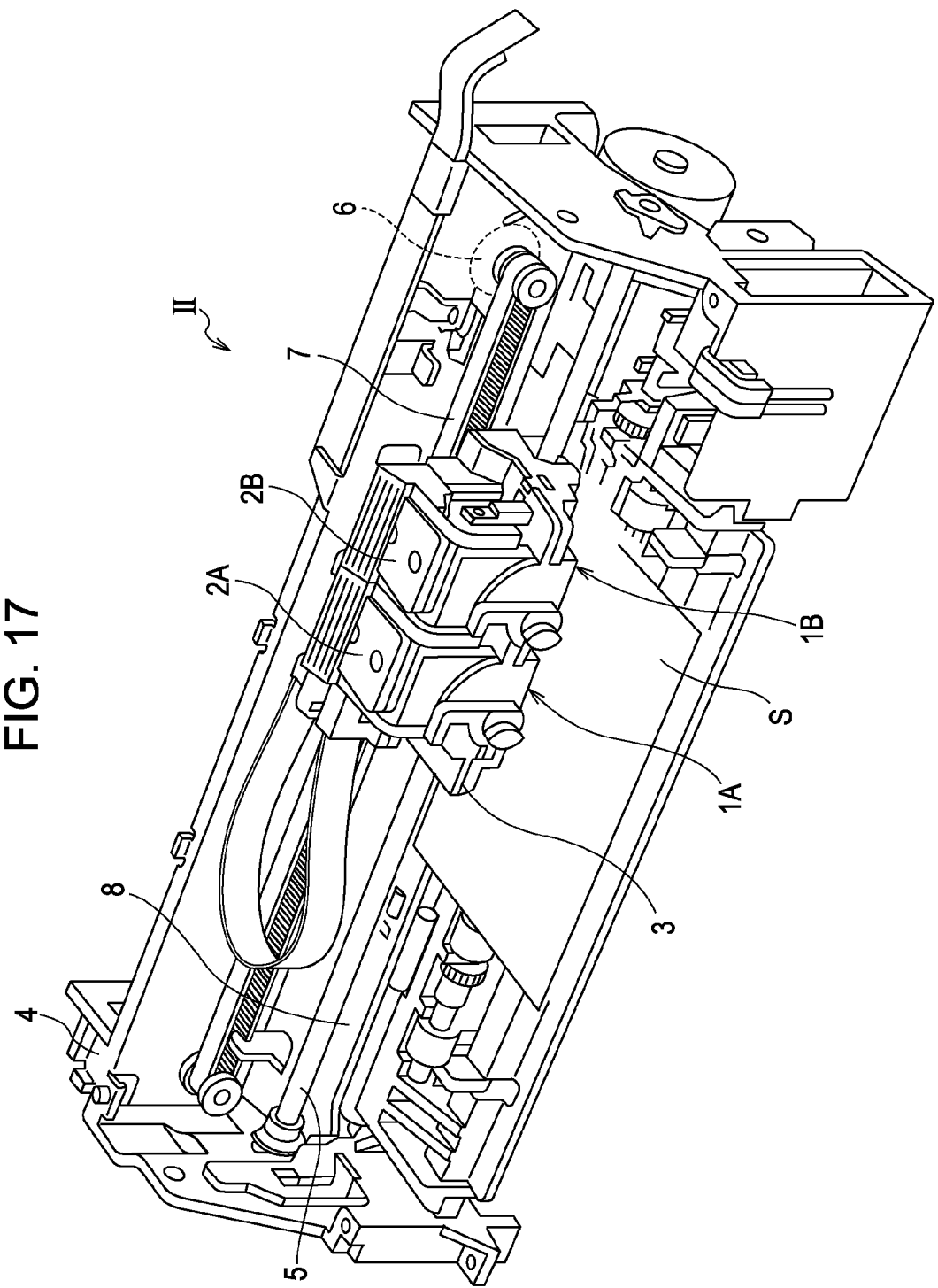
FIG. 17 is a view showing a schematic structure of a recording apparatus according to an embodiment of the invention.

Furthermore, the ink jet recording head of these embodiments constitutes a part of a recording head unit including an ink channel communicating with an ink cartridge and the like, and is mounted on an ink jet recording apparatus. FIG. 17 is a schematic view showing an example of such an ink jet recording apparatus.

An ink jet recording apparatus II shown in FIG. 17 includes recording head units 1A and 1B each including the ink jet recording head I. Cartridges 2A and 2B constituting ink supply units are detachably provided in the recording head units 1A and 1B, respectively. A carriage 3 mounting the recording head units 1A and 1B is provided on a carriage shaft 5 attached to a main body 4 of the apparatus so as to move in a direction of the shaft. The recording head units 1A and 1B eject, for example, a black ink composition and a color ink composition, respectively.

When a driving force of a driving motor 6 is transmitted to the carriage 3 through a plurality of gears (not shown) and a timing belt 7, the carriage 3 mounting the recording head units 1A and 1B is moved along the carriage shaft 5. A platen 8 is provided along the carriage shaft 5 in the main body 4. A recording sheet S, such as paper, used as a recording medium and fed by a paper-feeding roller (not shown) or the like is transported while being put around the platen 8.

In the embodiments described above, an ink jet recording head has been described as an example of a liquid ejecting head. However, the invention is widely used in overall liquid ejecting heads and can also be applied to liquid ejecting heads that eject a liquid other than ink. Examples of the other liquid ejecting heads include recording heads used in an image-recording apparatus such as a printer, coloring-material-ejecting heads used in producing a color filter of a liquid crystal display or the like, electrode-material-ejecting heads used for forming an electrode of an organic EL display, a field emission display (FED), or the like, and living-organic-matter-ejecting heads used for producing a biochip.

Furthermore, the application of the invention is not limited to a piezoelectric element mounted on a liquid ejecting head typified by an ink jet recording head. The invention can also be applied to piezoelectric elements mounted on other devices such as an ultrasonic device, e.g., an ultrasonic generator; an ultrasonic motor; a pressure sensor; and a pyroelectric sensor. Furthermore, the invention can also be similarly applied to ferroelectric elements such as a ferroelectric memory.

What is claimed is:
1. A liquid ejecting head comprising:
   a pressure-generating chamber communicating with a nozzle opening; and
   a piezoelectric element comprising a piezoelectric layer and electrodes,
   wherein the piezoelectric layer is composed of a compound oxide having a perovskite structure and containing bismuth ferrate manganate and bismuth potassium titanate.
2. The liquid ejecting head according to claim 1, wherein the piezoelectric layer has a thickness of 2 μm or less.
3. The liquid ejecting head according to claim 1, wherein the piezoelectric layer has a relative dielectric constant of 300 or more.
4. A liquid ejecting apparatus comprising: the liquid ejecting head according to claim 1.
5. The liquid ejecting head according to claim 1, wherein a molar ratio of the bismuth ferrate manganate to the bismuth potassium titanate, the ratio being represented by bismuth ferrate manganate/bismuth potassium titanate, is 0.42 or more and 1.5 or less.
6. A piezoelectric element, comprising:
   a piezoelectric layer and electrodes,
   wherein the piezoelectric layer is composed of a compound oxide having a perovskite structure and containing bismuth ferrate manganate and bismuth potassium titanate.

* * * * *